(12) United States Patent
Wood et al.

(10) Patent No.: US 8,866,316 B2
(45) Date of Patent: Oct. 21, 2014

(54) TUNABLE VIBRATION ENERGY HARVESTER AND METHOD

(75) Inventors: Alan Ruthven Wood, Christchurch (NZ); Qing Ou, Christchurch (NZ); Nigel Trevor Leigh, Canterbury (NZ); XiaoQi Chen, Christchurch (NZ); Stefanie Gutschmidt, Christchurch (NZ)

(73) Assignee: General Electric Company, Schenectady, NY (US)

( * ) Notice: Subject to any disclaimer, the term of this patent is extended or adjusted under 35 U.S.C. 154(b) by 247 days.

(21) Appl. No.: 13/529,412

(22) Filed: Jun. 21, 2012

(65) Prior Publication Data

US 2013/0341936 A1  Dec. 26, 2013

(51) Int. Cl.
*F03D 5/04* (2006.01)
*H02N 2/18* (2006.01)

(52) U.S. Cl.
CPC .................... *H02N 2/188* (2013.01)
USPC ....................................... 290/1 R

(58) Field of Classification Search
CPC ............................ H02N 2/188; H01L 41/1136
USPC ....................................... 290/1 R
See application file for complete search history.

(56) References Cited

U.S. PATENT DOCUMENTS

| 5,552,657 | A | 9/1996 | Epstein et al. | |
|---|---|---|---|---|
| 7,116,036 | B2 | 10/2006 | Balasubramaniam et al. | |
| 7,331,803 | B2 | 2/2008 | Steigerwald et al. | |
| 7,626,316 | B2 | 12/2009 | Kozinsky et al. | |
| 7,667,375 | B2 | 2/2010 | Berkcan et al. | |
| 7,839,058 | B1 * | 11/2010 | Churchill et al. | 310/339 |
| 7,880,246 | B2 | 2/2011 | Hohlfeld et al. | |
| 7,893,599 | B2 | 2/2011 | Morris et al. | |
| 7,898,157 | B2 * | 3/2011 | Churchill et al. | 310/339 |
| 7,986,076 | B2 | 7/2011 | Yoon et al. | |
| 8,080,920 | B2 | 12/2011 | Andosca et al. | |
| 8,222,754 | B1 * | 7/2012 | Soliman et al. | 290/1 R |
| 8,680,750 | B2 * | 3/2014 | Kang et al. | 310/339 |
| 2009/0085442 | A1 | 4/2009 | Kozinsky et al. | |
| 2010/0194240 | A1 | 8/2010 | Churchill et al. | |
| 2011/0095648 | A1 | 4/2011 | Zhang | |
| 2012/0250456 | A1 | 10/2012 | Tenghamn | |

FOREIGN PATENT DOCUMENTS

| JP | 2010051945 A | 3/2010 |
|---|---|---|
| WO | 2010141830 A2 | 12/2010 |
| WO | 2011026514 A1 | 3/2011 |
| WO | 2011099118 A1 | 8/2011 |
| WO | 2011136315 A1 | 11/2011 |

OTHER PUBLICATIONS

First Examination Report from NZ Application No. 611441 dated Jun. 14, 2013.

(Continued)

*Primary Examiner* — Tho D Ta
(74) *Attorney, Agent, or Firm* — Fletcher Yoder, P.C.

(57) ABSTRACT

In one embodiment, an energy harvester is provided. The energy harvester includes, an energy conversion device configured to convert vibrational energy to electrical energy, a mass coupled to the energy conversion device, and at least one biasing mechanism coupled to the mass. The biasing mechanism is selectively adjustable and selectively adjusting the biasing mechanism adjusts a resonance frequency of the energy conversion device and the mass.

15 Claims, 3 Drawing Sheets

(56) References Cited

OTHER PUBLICATIONS

S.P. Beeby et al., "Energy harvesting vibration sources for microsystems applications," Measurement of Science and Technology, vol. 17, 2006, pp. R175-R195.

Lihua Tang et al., "Toward Broadband Vibration-based Energy Harvesting," Journal of Intelligent Material Systems and Structures, vol. 21, Dec. 2010, pp. 1867-1895.

Scott Meninger et al., "Vibration-to-Electric Energy Conversion," IEEE Transactions on Very Large Scale Integration (VLSI) Systems, vol. 9, No. 1, Feb. 2001, pp. 64-76.

R. Torah et al., "Self-powered autonomous wireless sensor node using vibration energy harvesting," Measurement Science and Technology, vol. 19, 2008, pp. 1-8.

S. Roundy, "Energy Scavenging for Wireless Sensor Nodes with a Focus on Vibration-to Electricity Conversion," PowerPoint presentation, Feb. 19, 2003, University of California, Berkeley (39 pgs.).

* cited by examiner

TUNABLE VIBRATION ENERGY HARVESTER AND METHOD

BACKGROUND OF THE INVENTION

The field of the invention relates generally to energy harvesting and, more particularly, to a tunable vibration energy harvester.

Energy harvesting is a process for use in recovering power that would otherwise be dissipated or lost in a system. For example, known energy harvesting may be used to obtain energy from light, heat, wind, vibrations, wave action, water currents, and the like. In many known systems, energy harvested may be used in conjunction with battery power to provide power to electronic devices.

Sensor assemblies are often used in industrial settings to monitor the condition of associated machinery and operations thereof. Known sensor assemblies are often battery-powered. However, labor costs associated with changing batteries on a regular basis may limit commercial viability of such sensor assemblies, especially if the sensors are in remote or inaccessible locations. Because of the limited lifetime of batteries, the limited ability to recycle the batteries, and the cost of frequent battery change-outs, it is desirable to improve sensor powering.

BRIEF DESCRIPTION OF THE INVENTION

In one embodiment, an energy harvester is provided. The energy harvester includes, an energy conversion device configured to convert vibrational energy to electrical energy, a mass coupled to the energy conversion device, and at least one biasing mechanism coupled to the mass. The biasing mechanism is selectively adjustable and selectively adjusting the biasing mechanism adjusts a resonance frequency of the energy conversion device and the mass.

In another embodiment, a system is provided. The system includes a sensor and an energy harvester. The energy harvester includes an energy conversion device, a mass coupled to the energy conversion device and at least one biasing mechanism, and an actuator. The actuator is configured to selectively adjust the at least one biasing mechanism to selectively adjust a resonance frequency of the energy conversion device and the mass. The sensor is powered by electrical energy generated by the energy harvester.

A method of harvesting energy from a device producing vibrations at a driving frequency is described. The method includes providing energy harvester including an energy conversion device configured to convert vibrational energy into electrical energy, a mass coupled to the energy conversion device, and at least one biasing mechanism coupled to the mass, the biasing mechanism being selectively adjustable to adjust a resonance frequency of the energy conversion device and the mass. The method further includes coupling the energy harvester to the device producing vibrations and adjusting the biasing mechanism such that the resonance frequency substantially matches the driving frequency of the device producing vibrations.

DETAILED DESCRIPTION OF THE INVENTION

Figure 1:
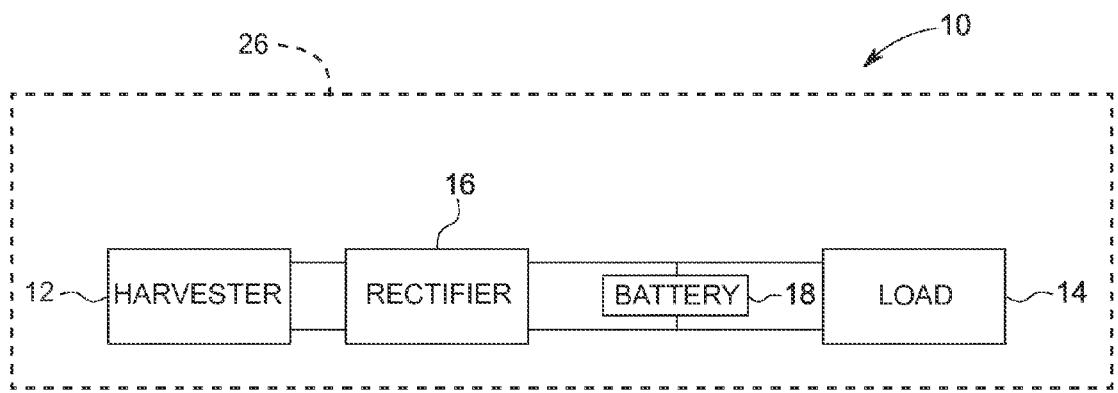
FIG. 1 is a block diagram of an exemplary power system.

FIG. 1 is a block diagram of an exemplary power system 10 that generally includes an energy harvesting device 12 that may be used to provide power to a load 14. Energy harvester 12 is a generation device that converts various types of mechanical vibrations into electrical power. For example, energy harvesting device 12 may use vibrations generated from motors, pumps, turbines, engines and the like, depending on specific applications.

In the exemplary embodiment, a rectifier 16 converts varying or alternating current (AC) generated by energy harvesting device 12 into a direct current (DC) signal. By way of non-limiting example, half-wave, full-wave, or voltage-doubling rectifiers may be used as well as voltage-multiplying circuits in general. The rectified power output discharged from rectifier 16 is used to power load 14. Alternatively, an optional energy storage device 18 may provide supplemental power to load 14 if the power generated by energy harvesting device 12 is insufficient to power load 14. In one embodiment, energy storage device 18 is, for example, a Lithium-ion battery and/or a super capacitor.

Figure 2:
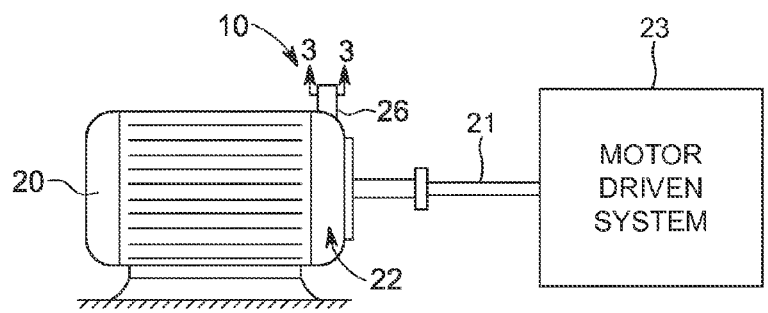
FIG. 2 is a schematic view of an exemplary energy harvester that may be used with the power system shown in FIG. 1.

FIG. 2 is a schematic view of the exemplary power system 10 implemented with an exemplary motor 20, which includes a shaft 21 rotatably supported by a bearing housing 22. Shaft 21 is coupled to a motor driven system 23 and rotates to power motor driven system 23. Bearing housing 22 of motor 20 typically vibrates to some degree during operation. Power system 10 is housed in a substantially cylindrical housing 26 attached to bearing housing 22 via any known means such as mechanical fastener, and/or adhesive, etc. Alternatively, housing 26 may have any shape or be fabricated from any suitable material that enables system 10 to function as described herein.

Figure 3:
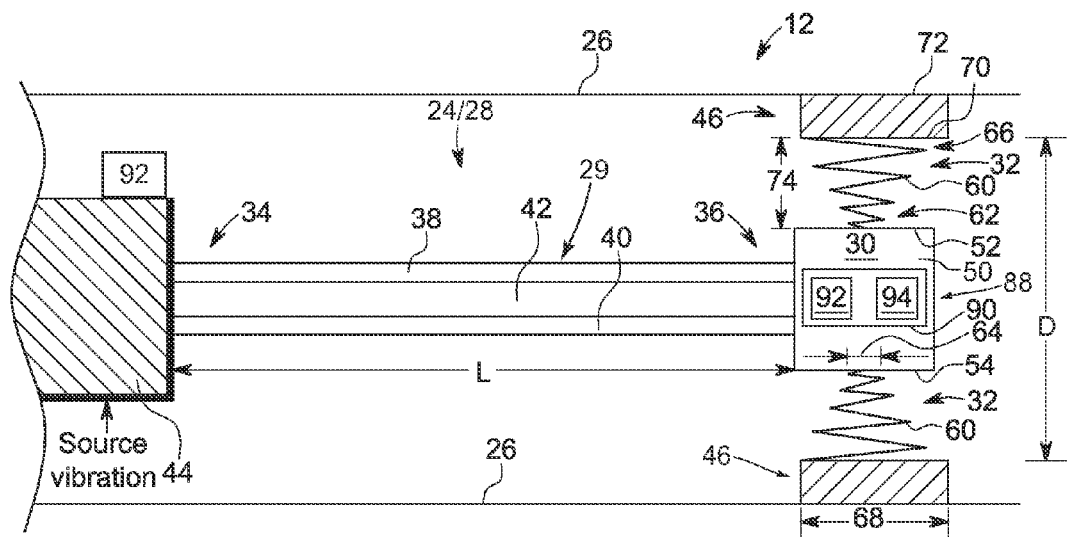
FIG. 3 is a cross-sectional view taken along line 3-3 of the energy harvester shown in FIG. 2.

FIG. 3 is a cross-sectional view of energy harvesting device 12 taken along line 3-3. More specifically, in the exemplary embodiment, energy harvesting device 12 includes housing 26, an energy conversion device 24, a proof mass 30, and at least one biasing mechanism 32. In the exemplary embodiment, energy conversion device 24 is a piezoelectric device 28. In an alternative embodiment, energy conversion device 24 is an electromagnetic, electrostatic, magnetostrictive or any other device that enables energy harvesting device 12 to function as described herein.

In the exemplary embodiment, piezoelectric device 28 is a cantilever beam 29 that includes a first end 34, a second end 36, a first piezoelectric layer 38, a second piezoelectric layer 40, and a substrate 42. Piezoelectric device 28 converts vibrational energy to electrical energy when piezoelectric material 38 and 40 is subjected to tension and compression, as is known. Piezoelectric device 28 may be fabricated from any suitable material such as, for example, lead zirconate titanate (PZT). In addition, piezoelectric device may include any number of piezoelectric layers 38 and 40 that enables piezoelectric device 28 to function as described herein. Further, in an alternative embodiment, piezoelectric device 28 may include a single piezoelectric layer that may or may not include a substrate.

In the exemplary embodiment, piezoelectric device 28 extends from a base 44 coupled to housing 26. First end 34 of beam 29 is coupled to base 44 and second end 36 is coupled to mass 30. Alternatively, first end 34 of beam 29 may be coupled to housing 26 or directly to a device that produces vibrations, such as motor 20. Substrate 42 reinforces first and second piezoelectric layers 38 and 40 and increases the tension and compression thereon to increase electrical energy generation. In an alternative embodiment, first and second ends 34 and 36 are each coupled to base 44 and/or housing 26 with mass 30 positioned between ends 34 and 36.

Piezoelectric device 28 and mass 30 have a resonance frequency corresponding to their oscillatory deflection from a rested state. In the exemplary embodiment, the resonance frequency of piezoelectric device 28 and mass 30 is mechanically tuned (i.e. adjusted) to substantially match the driving vibration frequency of motor 20, which is the frequency of the vibrations produced by motor 20 during operation. Matching the resonance frequency to the driving frequency facilitates maximum oscillatory deflection of device 28 and mass 30, thereby improving power output.

The design of piezoelectric device 28 may be adjusted or modified to fit specific applications or devices from which energy will be harvested. For example, the design of device 28 may be varied to optimize device characteristics such as resonance frequency tuning range, power output, size, weight and minimum base acceleration. For example, the length, width, thickness, stiffness and/or mass distribution of piezoelectric device 28 are variably selected to mechanically tune device 28 to facilitate optimizing power output. Similarly, the shape, weight, density and size of mass 30, as well as the location of mass 30, may also be variably selected to optimize power output. In the exemplary embodiment, piezoelectric device 28 has a length L between approximately 1 and 3 inches. More particularly, device 28 has a length L of approximately 2 inches.

In the exemplary embodiment, mass 30 includes a body 50 having a first side 52 and a second side 54. In one exemplary embodiment, mass 30 has a weight that is between approximately 1 and 1200 g. However, the design weight of mass 30 depends on the amount of power required to be produced by piezoelectric device 28. Thus, the weight of mass 30 may be variably selected. Power generated by piezoelectric device 28 generally increases as the weight of mass 30 increases and vice versa. In the exemplary embodiment, mass 30 is fabricated from a dense material that enables mass 30 to have a relatively small physical size. In the exemplary embodiment, mass 30 is generally cubic and each side has a length between approximately 40 and 100 mm. Alternatively, mass 30 may have any other shape that enables harvesting device 12 to function as described herein. Moreover, harvesting device 12 may be provided with a more compact design by utilizing one or more components of harvesting device 12 in mass 30 to provide the weight of mass 30. For example, an actuator 46, a gearbox and/or a motor (not shown) of actuator 46, electronics 90 and/or energy storage device 18 may be incorporated into mass 30.

The resonance frequency of piezoelectric device 28 and mass 30 is varied through adjustments of biasing mechanisms 32 and/or actuator 46. In the exemplary embodiment, biasing mechanisms 32 are non-linear springs such as preloaded conical springs 60. Alternatively, biasing mechanisms 32 may be any other device that exhibits a spring constant that changes when the device is compressed, for example, any mechanical, magnetic, and/or electronic device having such characteristics. In an alternative embodiment, biasing mechanisms 32 are tapered wire springs having an increased spring constant when compressed.

In the exemplary embodiment, springs 60 each include a first end 62 having a first diameter 64 and a second end 66 having a second diameter 68 that is larger than first diameter 64. Spring first ends 62 are each respectively coupled to first side 52 and to second side 54 of mass 30 such that mass 30 is positioned between springs 60.

In the exemplary embodiment, actuator 46 includes first surfaces 70, second surfaces 72, and a drive (not shown). The drive may include a motor and gearbox (not shown) and be coupled to base 44, incorporated into mass 30, or positioned anywhere else that enables the drive to actuate actuator 46 as described herein. First surfaces 70 are coupled to spring second ends 66, and second surfaces 72 are coupled to housing 26. Alternatively, springs 60 may be inverted such that first ends 62 are coupled to first actuator surfaces 70, and second ends 66 are coupled to mass 30. The drive actuates actuator 46 to move surfaces 70 and/or 72 away from housing. Thus, actuator 46 enables selective adjustments of a distance D between first and second surfaces 70 and 72 resulting in selective adjustment of a compression distance 74 of springs 60. In an alternative embodiment, actuator 46 may have any configuration that enables actuator 46 to selectively adjust compression distance 74 as described herein.

In the exemplary embodiment, energy harvester 12 also includes a controller 88 comprising electronics 90 such as sensors 92, a processor (not shown) and a memory 94. Electronics 90 receive and analyze system data and control operations of harvester 12 such as movement of actuator 46 and resonance frequency tuning of piezoelectric device 28 and mass 30. In the exemplary embodiment, electronics 90 are incorporated into mass 30 (FIG. 3) and enable actuation of actuator 46. Alternatively, electronics 90 are coupled to base 44, housing 26 and/or any other suitable location in energy harvester 12.

In the exemplary embodiment, sensors 92 gather data to enable electronics 90 to tune the resonance frequency of device 28 and mass 30 to the driving frequency of motor 20. Sensor 92 positioned on base 44 or housing 26 measures the driving frequency of motor 20, and sensor 92 positioned in or near mass 30 determines distance D between actuators 46, compression distances 74, and/or drive motor revolutions of actuators 46. In an alternative embodiment, sensors 92 are located anywhere that enables sensors 92 to function as described herein. Additionally, sensor 92 may measure the output voltage, current and/or power of the piezoelectric device 28.

In the exemplary embodiment, sensor 92 transmits a signal representing sensor measurements to electronics 90. Alternatively, or additionally, load 14 may include a sensor (not shown) that provides electronics 90 with a signal representing the driving frequency of motor 20 or other data about motor 20 or load 14. Data measured by sensors 92 may be used to selectively adjust actuator 46 and/or may be stored in memory 94. For example, if the measured data indicates harvester 12 is out of tune with the driving frequency of motor 20, adjustments are made to substantially match the resonance frequency to the driving frequency. Memory 94 stores a pre-calibrated look-up table of driving frequencies, resonance frequencies, and any other data that may enable tuning of energy harvester 12. Thus, if harvester 12 is out of tune, measured data and the look-up table are used to tune energy harvester 12. Memory 94 may alternatively, or additionally, store a linear or polynomial relationship correlating between a particular measurement and a resonance frequency of device 28.

Figure 4:
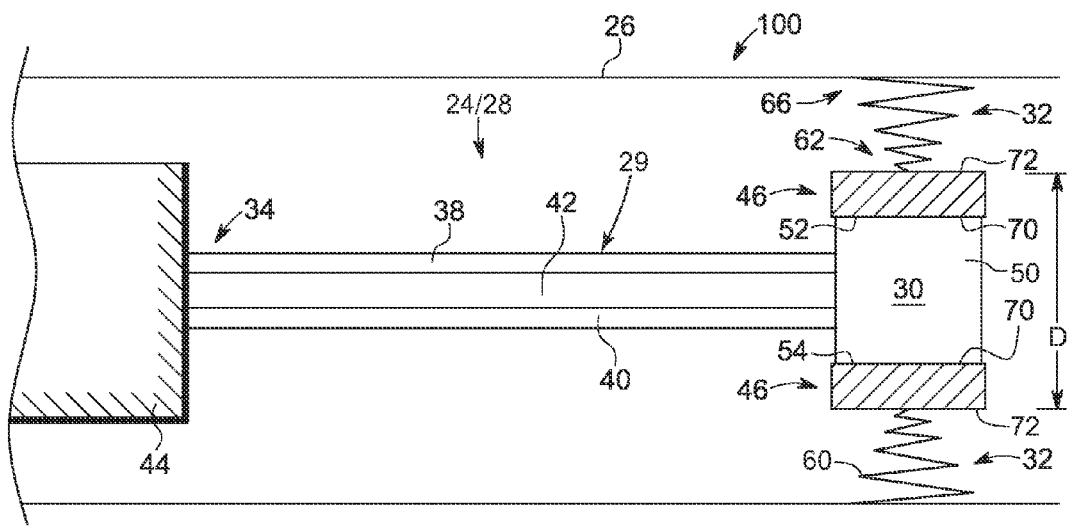
FIG. 4 is a cross-sectional view of an alternate energy harvester that may be used with the power system shown in FIG. 1.

FIG. 4 illustrates an exemplary alternative energy harvesting device 100 that is similar to energy harvesting device 12 (shown in FIG. 3), and identical reference numbers are used to identify the same components in FIG. 4 as were used in FIG. 3. Energy harvesting device 100 is similar to energy harvesting device 12, except device 100 includes an alternative arrangement of actuator 46. In the exemplary embodiment, actuator 46 is positioned between mass 30 and each biasing mechanism 32. More particularly, first actuator surfaces 70 are coupled to first side 52 and second side 54 of mass 30, respectively, while second actuator surfaces 72 are coupled to spring first ends 62, respectively. Spring second ends 66 are coupled to housing 26. Alternatively, springs 60 may be inverted such that first ends 62 are coupled to housing 26, and second ends 66 are coupled to second actuator surfaces 72. Actuator 46 is actuated to selectively adjust distance D between surfaces 70 and/or 72 resulting in selective adjustment of compression distances 74.

Figure 5:
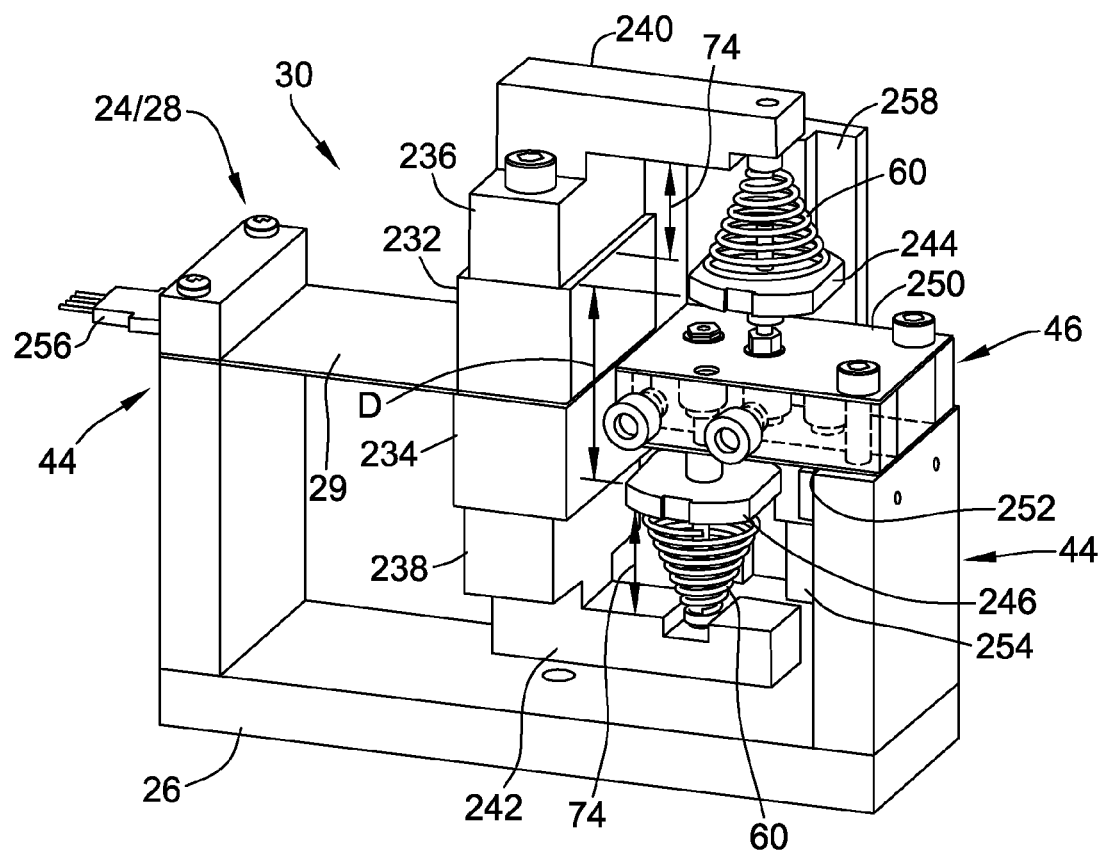
FIG. 5 is a perspective view of an alternate energy harvester that may be used with the power system shown in FIG. 1.

FIG. 5 illustrates an exemplary alternative energy harvesting device 200 that is similar to energy harvesting devices 12 and 100 (shown in FIGS. 3 and 4, respectively), and identical reference numbers are used to identify the same components in FIG. 5 as were used in FIGS. 3 and 4. Energy harvesting device 200 is similar to energy harvesting device 12 (shown in FIG. 3), except device 200 includes an alternative arrangement of mass 30 and actuator 46. More particularly, mass 30 includes opposed first and second portions 232 and 234 positioned between opposed third and fourth sections 236 and 238. First and second portions 232 and 234 are coupled to beam second end 36. Third and fourth sections 236 and 238 are coupled to first and second portions 232 and 234, respectively, and each have respective arms 240 and 242 extending therefrom.

In the alternative exemplary embodiment, actuator 46 is coupled to a portion of base 44 adjacent to first and second portions 232 and 234. A pair of platforms 244 and 246 is coupled a top and bottom actuator surface 250 and 252, respectively. Platforms 244 and 246 are moved towards and away from surfaces 250 and 252, respectively, by a motor 254 and gearbox (not shown) of actuator 46. A pair of guides 258 (one is removed in FIG. 5 for clarity) is positioned on either side of actuator 46 to support and guide platforms 244 and 246. A spring 60 is coupled between arm 240 and platform 244 and another spring 60 is coupled between arm 242 and platform 246. Actuator 46 selectively adjusts the distance D between platforms 244 and 246 resulting in selective adjustment of spring compression distances 74. Thus, the resonance frequency of piezoelectric device 28 and mass 30 is selectively adjusted. Resulting electrical energy produced by device 28 is provided via connector 256 to rectifier 16.

During operation, system 10 is coupled to a vibration producing device, such as motor 20. Vibrations generated by motor 20 are converted into electrical power by energy harvesting device 12, 100 or 200. In the exemplary embodiment, load 14 is a wireless sensor that is powered by energy harvesting device 12. Wireless sensor 14 may be, for example, a machine condition monitoring system that measures key indicators such as vibrations, temperatures and pressures of critical machines, and tracks the information over time to look for abnormalities. In the exemplary embodiment, wireless sensor 14 is an accelerometer that assesses health, alignment and/or balance of motor 20 based on captured vibration data. For example, vibrations generated by motor 20 change with aging of motor 20. The changes may be detected and transmitted to a remote location by wireless sensor 14 for storage or further processing, for example, to assess the condition of motor 20 and its need for maintenance.

As described above, energy harvesting devices 12, 100 and 200 convert vibrations into electrical energy. During operation, base 44 is subjected to vibration energy causing movement of mass 30 and deflection of piezoelectric beam 28. Deflection of first and second piezoelectric layers 38 and 40 generates AC voltage. The AC voltage is delivered to rectifier 16 wherein it is converted into DC voltage that is provided to wireless sensor 14 to power sensor operations.

During operation, energy harvester 12 power output is optimized by substantially matching (or tuning) the harvester resonance frequency to the driving frequency of the source vibration. Because many known modern industrial processes are often variable speed, the resonance frequency of energy harvester 12 is variably selected to substantially match the frequency of the changing source vibration. Power is generated more effectively when the resonance frequency of harvester 12 substantially matches the source frequency of motor 20.

In the exemplary embodiment, the resonant frequency of energy harvester 12 depends on the total spring constant of the system, which is equal to the sum of the spring constant of piezoelectric beam 28 and of springs 60. While the spring constant of beam 28 is relatively constant due to design, the spring constant of springs 60 increases as compression distance 74 is increased. Thus, the resonant frequency of energy harvester 12 is tuned by adjusting compression distance 74 of each spring 60. Tuning of energy harvester 12 is facilitated by selectively increasing or decreasing distance D between actuator surfaces 70 and 72 or platforms 244 and 246, such that compression distances 74 of biasing mechanisms 32 are selectively varied.

During operation, if harvester 12 is out of tune, electronics 90 automatically adjusts compression distances 74 by actuating actuator 46 based on the frequency look-up table stored in memory 94. Compression distance 74 is adjusted based on the frequency look-up table stored in memory 94. More specifically, the look-up table includes data usable to determine a desired position of actuator surfaces 70 and/or 72 or platforms 244 and 246, and/or a desired compression distance 74. Based on the measured driving frequency, electronics 90 determines the required compression distance 74 in the look-up table required to match the driving frequency and adjusts actuator 46 accordingly. In addition, the look-up table may store any other data usable to tune harvesting device 12 such as, but not limited to, temperature and humidity adjustments, aging of the piezoelectric material and/or drive motor revolutions of actuator 46. Moreover, the look-up table may be automatically updated to improve system efficiency.

Sensor 92 measures the driving frequency of the vibration source 20, and electronics 90 determines compression distance 74 that corresponds to the measured driving frequency based on the look-up table stored in memory 94. The range of compression distances 74 corresponds to a range of resonance frequencies for energy harvester 12. Thus, based on the measured driving frequency, actuator 46 adjusts compression distances 74 to substantially match the resonance frequency of energy harvester 12 with the driving frequency of vibration source 20. As such, energy output of harvester 12 is facilitated to be maximized. Thus, in the exemplary embodiment, electronics 90 are configured to automatically tune the resonance frequency of energy harvester 12 as the vibration source 20 changes.

The exemplary energy harvester described above efficiently generates power over a wide range of vibration frequencies by automatically tuning the resonance frequency of the harvester. Such adjustments enable the energy harvester to be useful in physically small and/or remote locations. In addition, because of the relatively few moving parts of the system, wear is reduced and the harvester may be manufactured at a lower cost without the need for high precision and/or consistency, as compared to known harvesters. For the same reason, mechanical damping is minimized, which facilitates a higher energy output. Further, by harvesting power from the environment, sensors can be made self sufficient over their lifetime with virtually no maintenance. Thus, the exemplary energy harvester described herein can be built into wireless sensors or systems for maintenance free machine-condition monitoring. Furthermore, batteries used to power wireless sensors may be reduced in size or even eliminated, thus reducing maintenance and environmental impact.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. An energy harvester comprising:
   an energy conversion device configured to convert vibrational energy into electrical energy;
   an actuator;
   a first platform movably coupled to the actuator;
   a second platform movably coupled to the actuator, wherein the first and second platforms are movably coupled to opposite sides of the actuator;
   a mass coupled to the energy conversion device;
   a first biasing mechanism having a first end coupled to the mass and a second end coupled to the first platform; and
   a second biasing mechanism having a third end coupled to the mass and a fourth end coupled to the second platform;
   wherein the actuator is configured to selectively adjust a distance between the first and second platforms that adjusts respective compression distances of the first and second biasing mechanisms and a resonance frequency of the energy conversion device and the mass.

2. The energy harvester of claim 1, wherein the first biasing mechanism comprises a first non-linear spring and the second biasing mechanism comprises a second non-linear spring.

3. The energy harvester of claim 1, further comprising a sensor configured to sense at least one of a position of the actuator, the respective compression distances of the first and second biasing mechanisms, motor revolutions of the actuator, and a driving frequency of an object the harvesting device is configured to couple to.

4. The energy harvester of claim 1, further comprising a controller comprising a memory, the controller programmed to control the actuator based on a look-up table of resonance frequencies stored in the memory.

5. The energy harvester of claim 1, wherein the energy conversion device comprises one of a piezoelectric device, an electromagnetic device, an electrostatic device, and a magnetostrictive device.

6. The energy harvester of claim 5, wherein the piezoelectric device further comprises a first piezoelectric layer, a second piezoelectric layer, and a substrate extending therebetween.

7. The energy harvester of claim 1, wherein the first biasing mechanism comprises a first conical spring and the second biasing mechanism comprises a second conical spring.

8. The energy harvester of claim 7, wherein the first conical spring comprises the first end having a first diameter and the second end having a second diameter that is larger than the first diameter.

9. A system comprising:
   a device producing vibrations at a driving frequency;
   a sensor coupled to the device; and
   an energy harvester comprising an energy conversion device, a mass coupled to the energy conversion device and at least one biasing mechanism, an actuator configured to selectively adjust a compression distance of the at least one biasing mechanism to selectively adjust a resonance frequency of the energy conversion device and the mass, and a controller configured to automatically adjust the compression distance and the resonance frequency via the actuator,
   wherein the sensor is powered by electrical energy generated by the energy harvester and is configured to provide feedback of the driving frequency to the controller, and the controller is configured, via the actuator, to automatically adjust the compression distance of the biasing mechanism such that the resonance frequency substantially matches the driving frequency of the device producing vibrations.

10. The system of claim 9, wherein the energy conversion device comprises one of a piezoelectric device, an electromagnetic device, an electrostatic device, and a magnetostrictive device.

11. The system of claim 9, wherein the sensor is configured to provide data about the device producing vibrations to a remote monitoring system.

12. The system of claim 9, wherein the sensor is configured to monitor the health of at least one of an engine, a motor, a turbine, and an industrial process.

13. A method of harvesting energy from a device producing vibrations at a driving frequency, the method comprising:
   coupling an energy harvester to the device producing vibrations, wherein the energy harvester comprises an energy conversion device configured to convert vibrational energy into electrical energy, a mass coupled to the energy conversion device, at least one biasing mechanism coupled to the mass, an actuator coupled to the biasing mechanism and configured to adjust a compression distance of the biasing mechanism to adjust a resonance frequency of the energy conversion device and the mass, and a controller configured to automatically adjust the compression distance and the resonance frequency via the actuator;
   providing, via a sensor, feedback of the driving frequency of the device to the controller; and
   automatically adjusting, via the controller, the compression distance of the biasing mechanism such that the resonance frequency substantially matches the driving frequency of the device producing vibrations.

14. The method of claim 13, wherein the controller comprises a memory, wherein adjusting the compression distance of the biasing mechanism comprises adjusting the compression distance of the biasing mechanism based on a look-up table stored in the memory.

15. An energy harvester comprising:
   an energy conversion device configured to convert vibrational energy into electrical energy;
   a mass coupled to the energy conversion device;
   a first actuator having a first surface and a second surface, wherein the first surface is coupled to a first side of the mass;

a second actuator having a third surface and a fourth surface, wherein the third surface is coupled to a second side of the mass, wherein the second side is opposite the first side;

a first biasing mechanism having a first end coupled to the second surface of the first actuator and a second end coupled to a housing of the energy harvester at a first location; and a second biasing mechanism having a third end coupled to the fourth surface of the second actuator and a fourth end coupled to the housing of the energy harvester at a second location opposite the first location;

wherein the actuator is configured to selectively adjust a distance between second and fourth surfaces of the first and second actuators, respectively, that adjusts respective compression distances of the first and second biasing mechanisms and a resonance frequency of the energy conversion device and the mass.

\* \* \* \* \*